United States Patent
Kobayashi

(10) Patent No.: US 11,545,384 B2
(45) Date of Patent: Jan. 3, 2023

(54) ELECTROSTATIC CHUCK AND SUBSTRATE FIXING DEVICE

(71) Applicant: SHINKO ELECTRIC INDUSTRIES CO., LTD., Nagano (JP)

(72) Inventor: Hiroyuki Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 87 days.

(21) Appl. No.: 17/160,925

(22) Filed: Jan. 28, 2021

(65) Prior Publication Data
US 2021/0242066 A1   Aug. 5, 2021

(30) Foreign Application Priority Data
Jan. 31, 2020 (JP) .............................. JP2020-014639

(51) Int. Cl.
*H01T 23/00*   (2006.01)
*H01L 21/683*   (2006.01)
*H01L 21/67*   (2006.01)

(52) U.S. Cl.
CPC .... *H01L 21/6833* (2013.01); *H01L 21/67103* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 6,093,916 A * | 7/2000 | Toyoizumi | G03G 15/2003 219/486 |
| 2016/0379853 A1 | 12/2016 | Schaller et al. | |
| 2020/0294836 A1 * | 9/2020 | Criminale | H01L 22/20 |

FOREIGN PATENT DOCUMENTS

JP    2018-525813    9/2018

* cited by examiner

*Primary Examiner* — Stephen W Jackson
(74) *Attorney, Agent, or Firm* — Rankin, Hill & Clark LLP

(57) ABSTRACT

An electrostatic chuck is configured to adsorb and retain an object thereon. The electrostatic chuck includes: a base body on which the object is mounted; an electrostatic electrode that is provided in the base body; a plurality of heating elements that are provided in the base body; and a plurality of current control elements that are provided in the base body, and each of which is connected in series with a corresponding one of the heating elements. Each of operations of the current control elements is controlled in accordance with light radiated toward a corresponding one of the current control elements from an outside of the base body.

9 Claims, 9 Drawing Sheets

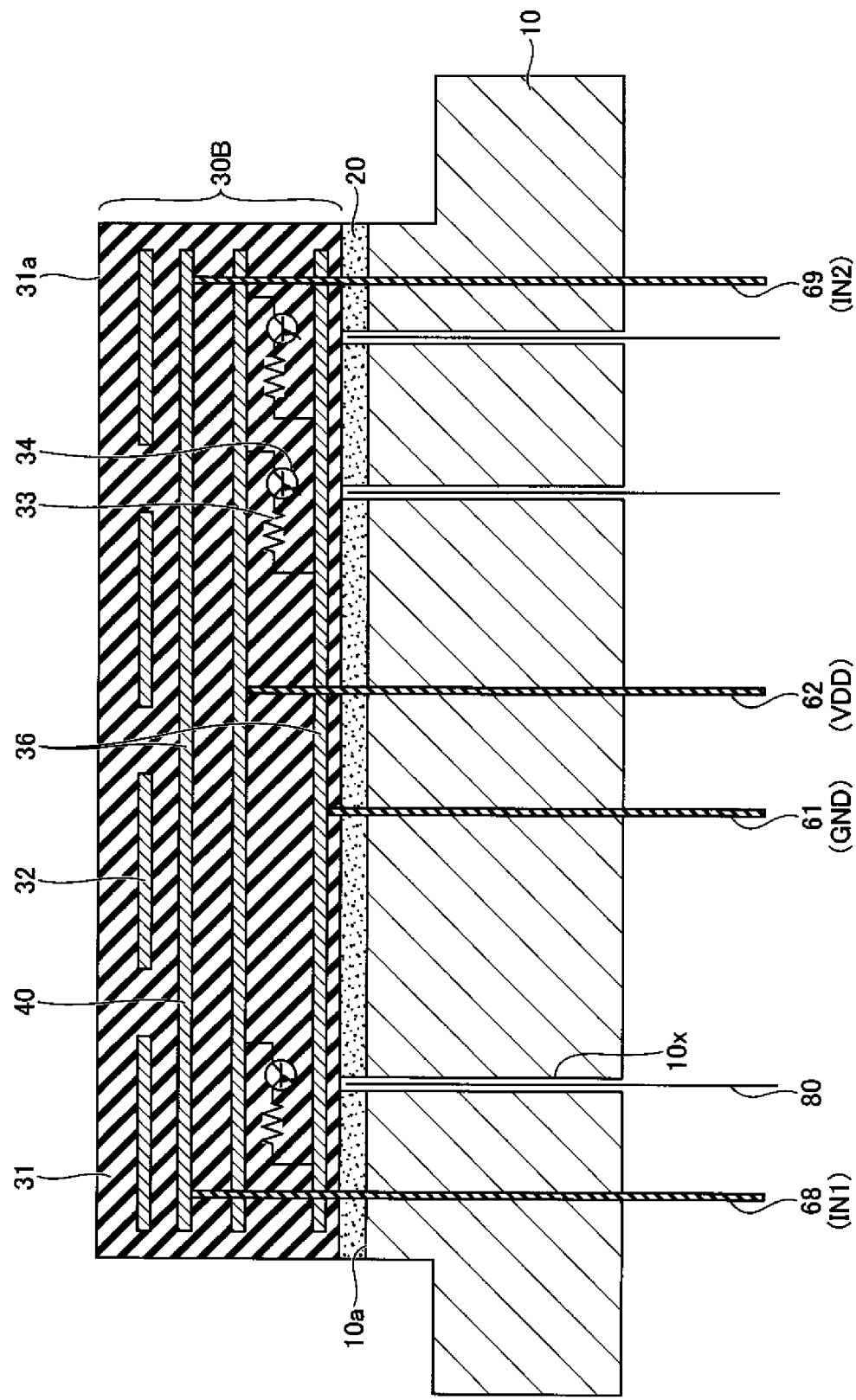

ELECTROSTATIC CHUCK AND SUBSTRATE FIXING DEVICE

This application claims priority from Japanese Patent Applications No. 2020-014639, filed on Jan. 31, 2020, the entire contents of which are herein incorporated by reference.

BACKGROUND

Technical Field

The present disclosure relates to an electrostatic chuck and a substrate fixing device.

BACKGROUND ART

In the background art, a film forming apparatus or a plasma etching apparatus used in manufacturing a semiconductor device has a stage for accurately retaining a wafer thereon in a vacuum processing chamber. For example, a substrate fixing device that adsorbs and retains a wafer by an electrostatic chuck mounted on a base plate has been proposed as such a stage.

As an example of the substrate fixing device, there is a substrate fixing device having a structure in which heating elements for adjusting temperature of a wafer are provided. As to this substrate fixing device, for example, a proposal has been made for a method in which resistors are built as the heating elements in an electrostatic chuck and electric power is applied to the resistors to make the resistors generate heat, or for a method in which light emitting diodes used as the heating elements are arranged as a regular array with a fixed number of rows and a fixed number of columns or arrayed in connection with diameters of concentric circles so that the outer one of the concentric circles has a larger number of light emitting diodes than the inner one of the concentric circles (e.g. see JP-A-2018-525813).

However, in order to control the plurality of heating elements independently in the substrate fixing device, a large number of electric wires for the control need to be led out to the outside of the electrostatic chuck. Further, the electric wires led out to the outside of the electrostatic chuck need to be led out to the outside via through holes formed in the base plate. Therefore, as the number of the electric wires increases, the number of the through holes also increases. That is, due to the increase in the number of the electric wires, an area occupied by the through holes in the base plate increases, and the degree of freedom for designing the base plate decreases.

SUMMARY

The present disclosure provides an electrostatic chuck that can suppress a decrease in the degree of freedom for designing a base plate even in a case where a plurality of heating elements are provided in the electrostatic chuck.

A certain embodiment provides an electrostatic chuck configured to adsorb and retain an object thereon.

The electrostatic chuck includes:
a base body on which the object is mounted;
an electrostatic electrode that is provided in the base body;
a plurality of heating elements that are provided in the base body; and
a plurality of current control elements that are provided in the base body, and each of which is connected in series with a corresponding one of the heating elements.

Each of operations of the current control elements is controlled in accordance with light radiated toward a corresponding one of the current control elements from an outside of the base body.

BRIEF DESCRIPTION OF DRAWINGS

FIG. 9 is a schematic cross-sectional view illustrating a substrate fixing device according to a modification 2 of the first embodiment in a simplified manner.

DESCRIPTION OF EMBODIMENT

An embodiment of the disclosure will be described below with reference to the drawings. In each of the drawings, like constituent portions will be designated by like reference signs correspondingly and respectively, and duplicate description about these constituent portions may be omitted.

First Embodiment

Figure 1:
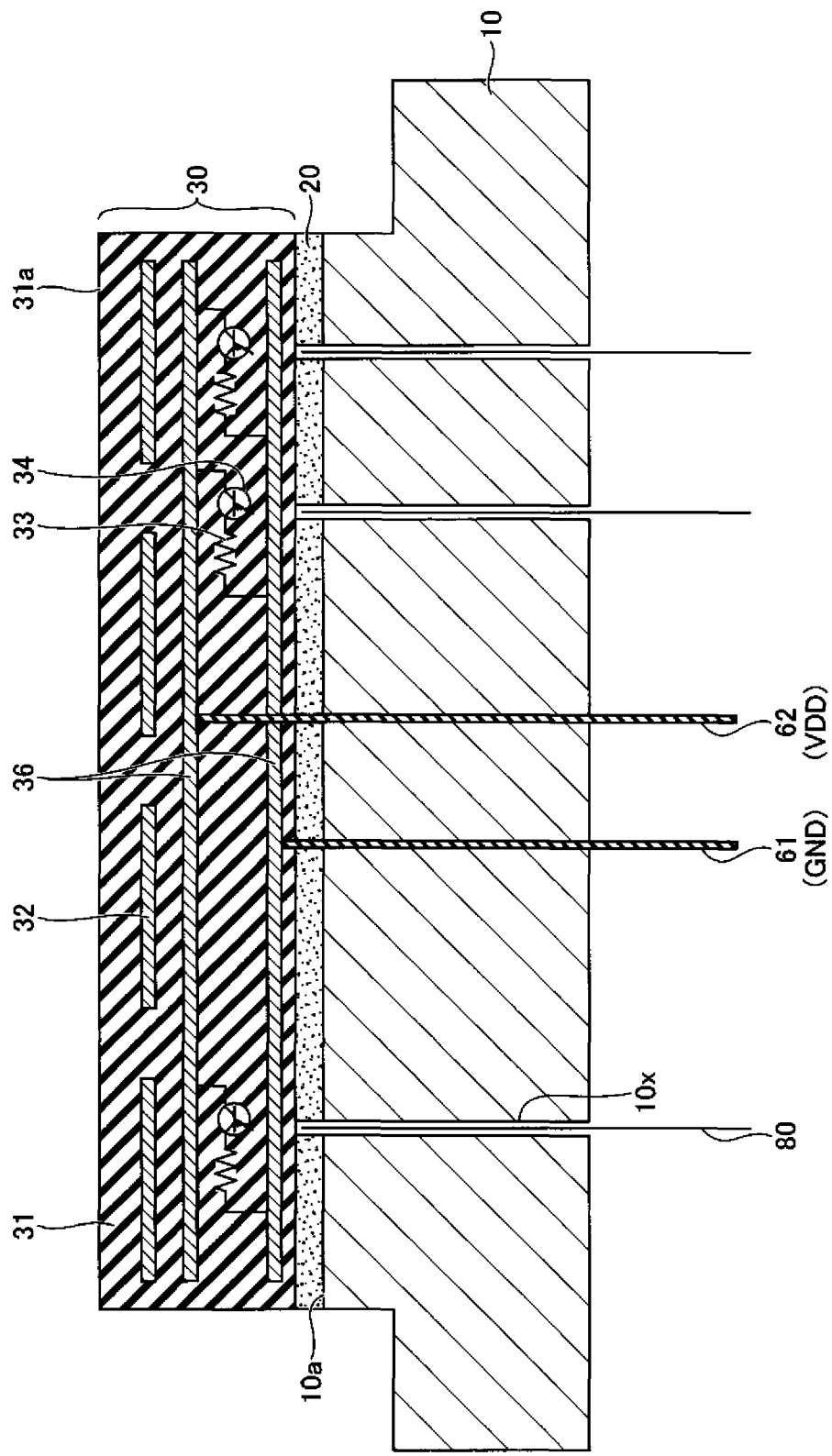
FIG. 1 is a schematic cross-sectional view illustrating a substrate fixing device according to a first embodiment in a simplified manner.

FIG. 1 is a schematic cross-sectional view illustrating a substrate fixing device according to a first embodiment in a simplified manner. With reference to FIG. 1, the substrate fixing device 1 has a base plate 10, an adhesive layer 20, an electrostatic chuck 30, and optical fibers 80 as main constituent elements. The substrate fixing device 1 is a device that adsorbs and retains a substrate (such as a water) which is an adsorption object, by the electrostatic chuck 30 mounted on one face of the base plate 10.

The base plate 10 is configured to mount the electrostatic chuck 30 thereon. The base plate 10 is, for example, about 20 mm to 40 mm thick. The base plate 10 which is, for example, formed out of aluminum can be used as an electrode or the like for controlling plasma. By predetermined high frequency electric power supplied to the base plate 10, energy for making ions etc. in a plasma state collide against the substrate adsorbed on the electrostatic chuck 30 can be controlled so as to etch the substrate effectively.

A gas supply path into which inert gas for cooling the substrate adsorbed on the electrostatic chuck 30 is introduced may be provided in the base plate 10. When, for example, the inert gas such as He or Ar is introduced into the gas supply path from the outside of the substrate fixing device 1 and supplied to a back face of the substrate adsorbed on the electrostatic chuck 30, the substrate can be cooled.

A refrigerant flow path may be provided in the base plate 10. The refrigerant flow path is, for example, a hole that is formed annularly inside the base plate 10. For example, a refrigerant such as cooling water or Galden is introduced into the refrigerant flow path from the outside of the substrate fixing device 1. When the refrigerant is circulated in the refrigerant flow path to cool the base plate 10, the substrate adsorbed on the electrostatic chuck 30 can be cooled.

The electrostatic chuck 30 is configured to adsorb and retain the substrate which is the adsorption object. The planar shape of the electrostatic chuck 30 is, for example, a circle. The diameter of the substrate which is the object adsorbed by the electrostatic chuck 30 is, for example, 8, 12, or 18 inches.

Assume here that a plan view denotes a view of an object from a normal direction of an upper face 10a of the base plate 10, and a planar shape denotes the shape of the object viewed from the normal direction of the upper face 10a of the base plate 10.

The electrostatic chuck 30 is provided on the upper face 10a of the base plate 10 through the adhesive layer 20. The adhesive layer 20 is, for example, a silicone-based adhesive agent. The adhesive layer 20 is, for example, about 0.1 mm to 2.0 mm thick. The adhesive layer 20 adhesively bonds the base plate 10 and the electrostatic chuck 30 to each other, and has an effect of reducing stress caused by a difference in coefficient of thermal expansion between the electrostatic chuck 30 made of ceramics and the base plate 10 made of aluminum.

The electrostatic chuck 30 has a base body 31, an electrostatic electrode 32, a plurality of heating elements 33, a plurality of current control elements 34, and wiring 36 as main constituent elements. An upper face of the base body 31 is a mounting face 31a on which the adsorption object is mounted. The electrostatic chuck 30 is, for example, a Johnsen-Rahbek type electrostatic chuck. However, the electrostatic chuck 30 may be a Coulomb force type electrostatic chuck alternatively.

The base body 31 is a dielectric. For example, ceramics such as aluminum oxide ($Al_2O_3$) or aluminum nitride (AlN) is used as the base body 31. The base body 31 may contain, as auxiliary agents, oxides of two or more elements that are, for example, selected from the group consisting of silicon (Si), magnesium (Mg), calcium (Ca), aluminum (Al), and yttrium (Y). The base body 31 is, for example, about 5 mm to 10 mm thick. A relative dielectric constant of the base body 31 (at 1 kHz) is, for example, about 9 to 10.

The electrostatic electrode 32 which is, for example, a thin film electrode is built in the base body 31. When the electrostatic electrode 32 is connected to a power supply provided outside the substrate fixing device 1 and a predetermined voltage is applied to the electrostatic electrode 32 from the power supply, adsorptive force is generated between the electrostatic electrode 32 and the wafer due to static electricity. Thus, the wafer can be adsorbed and retained on the mounting face 31a of the base body 31 of the electrostatic chuck 30. As the voltage applied to the electrostatic electrode 32 is higher, the adsorptive retention force is stronger. The electrostatic electrode 32 may have a unipolar shape or a bipolar shape. For example, tungsten, molybdenum, or the like is used as the material of the electrostatic electrode 32.

Figure 2:
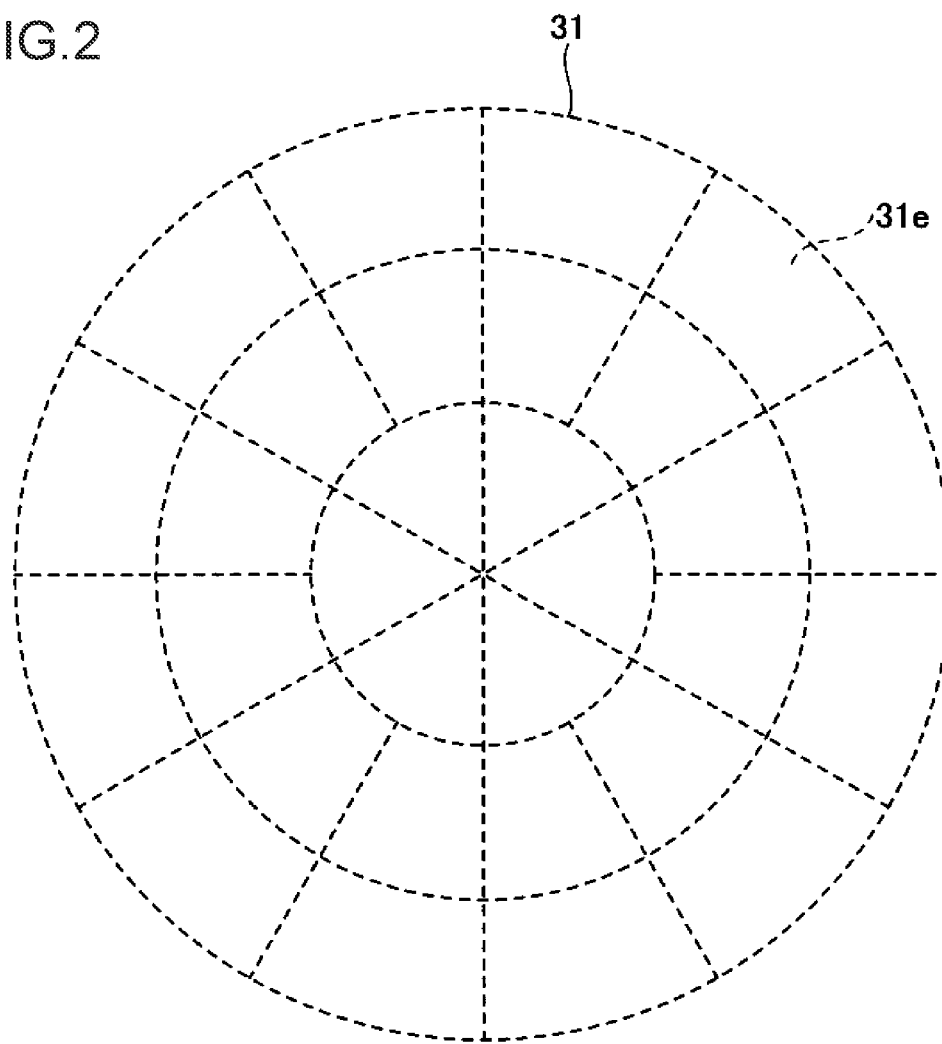
FIG. 2 is a plan view illustrating temperature-controllable regions defined in a base body.

FIG. 2 is a plan view illustrating temperature-controllable regions defined in the base body. As shown in FIG. 2, the plurality of temperature-controllable regions 31e whose temperatures can be independently controlled are defined in the base body 31 in the plan view. In the example of FIG. 2, thirty temperature-controllable regions 31e are defined. However, the number of the temperature-controllable regions 31e may be set in a range of about 100 to 200 alternatively. Further, each of the temperature-controllable regions 31e can have any planar shape. The temperature-controllable region 31 does not necessarily have to be substantially divided into a concentric shape but may be, for example, substantially divided into a grid shape.

Figure 3:
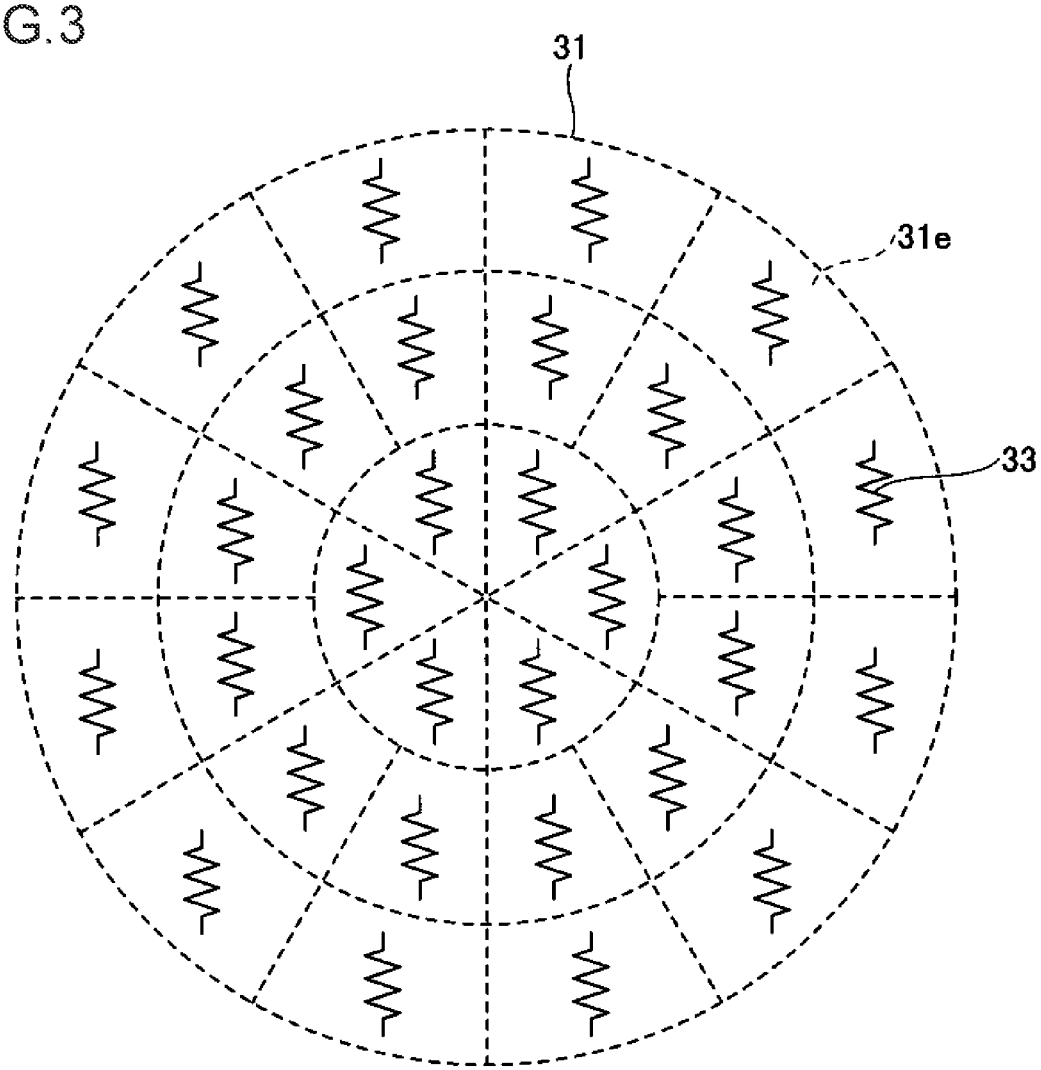
FIG. 3 is a plan view schematically illustrating heating elements disposed in the temperature-controllable regions respectively.

FIG. 3 is a plan view schematically showing the heating elements disposed in the temperature-controllable regions respectively. The heating elements 33 are heaters that are built in the base body 31, and that generate heat to heat the mounting face 31a of the base body 31 to a predetermined temperature when a current flows into the heaters.

As shown in FIG. 3, one heating element 33 is disposed in each of the temperature-controllable regions 31e. The heating elements 33 disposed in the temperature-controllable regions 31e respectively are insulated from one another. By changing the value of the current flowing into each of the heating elements 33, an amount of heat generated by the heating element 33 can be changed independently. In this manner, the plurality of temperature-controllable regions 31e whose temperatures can be controlled independently are defined in the base body 31 and the heating elements 33 are disposed in the temperature-controllable regions 31e respectively. With this arrangement, the mounting face 31a of the base body 31 can be heated uniformly.

The heating elements 33 can, for example, heat the temperature of the mounting face 31a of the base body 31 to about 50° C. to 200° C. For example, tungsten (W), copper (Cu), nickel (Ni), constantan (Cu/Ni/Mn/Fe alloy), or the like can be used as the material of the heating elements 33. Each of the heating elements 33 is, for example, about 20 μm to 100 μm thick. The heating element 33 can be, for example, formed into a predetermined pattern such as a zigzag pattern.

Figure 4:
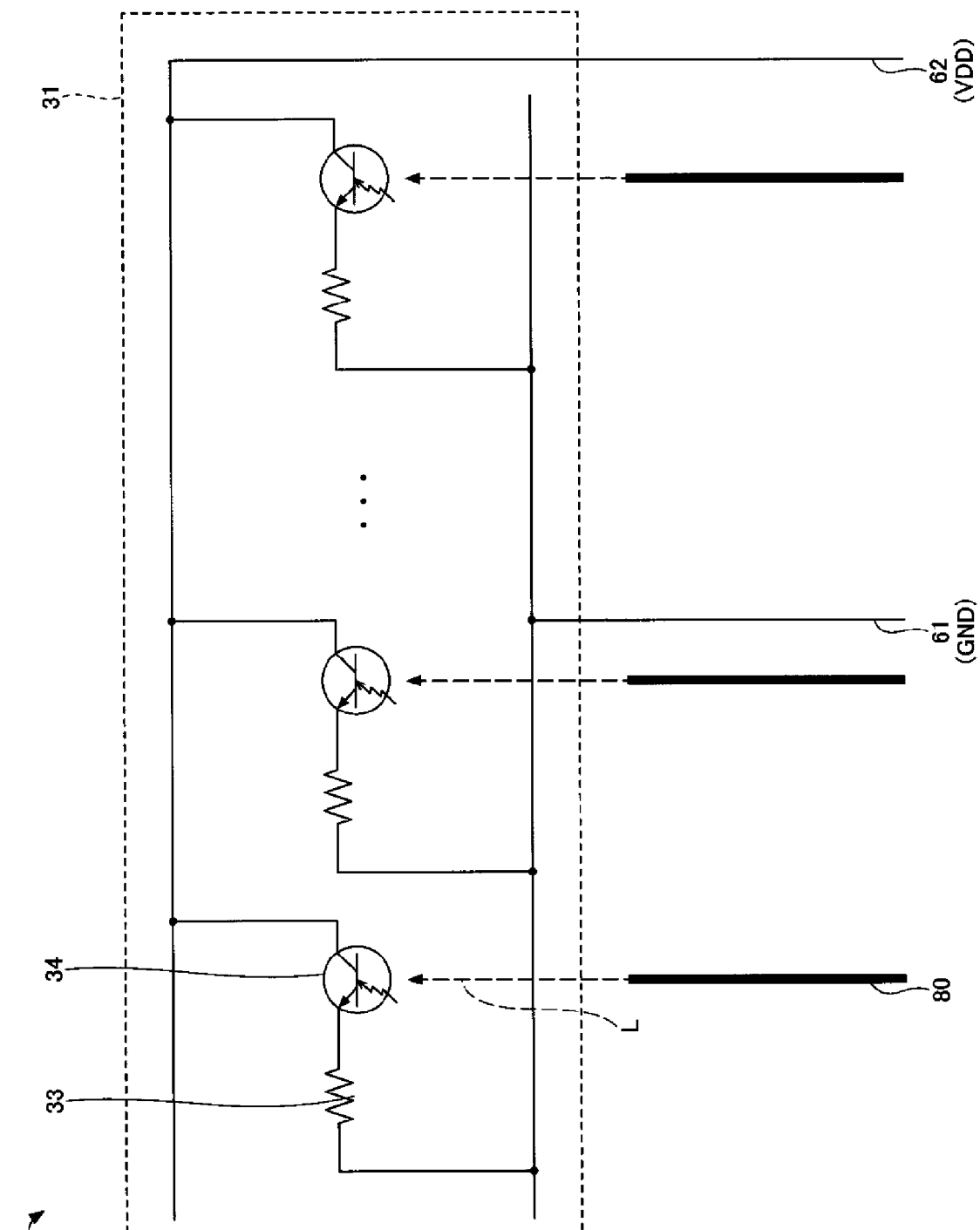
FIG. 4 is a diagram illustrating electrical connection between heating elements and current control elements in the substrate fixing device according to the first embodiment.

FIG. 4 is a diagram illustrating electrical connection between heating elements and current control elements in the substrate fixing device according to the first embodiment. As shown in FIG. 4, the current control elements 34 are built in the base body 31, and one heating element 33 is connected in series with one current control element 34. Each of light receivers of the current control elements 34 is exposed to the outside of the base body 31 so that the light receiver of the current control element 34 can receive light from the outside of the base body 31. In FIG. 4, L designates the light (such as laser light or light of a light emitting diode) radiated from an optical fiber 80 toward the light receiver of the current control element 34.

The current control element 34 is an element whose operation is controlled by the reception of the light. When the light is radiated onto the light receiver of the current control element 34 from the outside of the base body 31, the current control element 34 is electrically conducted to allow a predetermined current to flow into the heating element 33 connected to the current control element 34 so that the heating element 33 generates heat. The current control element 34 is, for example, a phototransistor. However, the current control element 34 may be a photoresistor (CdS cell), a solar cell, or the like alternatively. The size of the current control element 34 is, for example, about 3 mm in length×3 mm in width×1 mm in height.

In the example of FIG. 4, the current control element 34 is the phototransistor. The current control element 34 has a first terminal (emitter) electrically connected to one end of the heating element 33, and the other end of the heating element 33 is electrically connected to the ground GND. The current control element 34 has a second terminal (collector) electrically connected to a VDD (power supply). It is preferable that a highly heat-resistant phototransistor is used as the current control element 34.

An electric wire 61 connected to the ground GND is led out to the outside of the substrate fixing device 1. An electric wire 62 (VDD) connected to the power supply VDD is led out to the outside of the substrate fixing device 1. Further, one optical fiber 80 is assigned to one current control element 34, and each of the optical fibers 80 is led out to the outside of the substrate fixing device 1.

The electric wire 61, the electric wire 62 and the optical fibers 80 are directly led out to the outside of the substrate fixing device 1. Alternatively, a socket may be provided on the base plate 10 so that the electric wire 61, the electric wire 62 and the optical fibers 80 can be connected to the outside of the substrate fixing device 1 through the socket.

When the light is radiated onto each of the light receivers of the current control elements 34 from the outside of the substrate fixing device 1 through the optical fiber 80, the current control element 34 is electrically conducted to allow the current to flow into the heating element 33 connected to the current control element 34, In this manner, the current control element 34 can function as a switch to perform an ON/OFF operation in accordance with the light from the outside of the substrate fixing device 1. An amount of heat generated by the heating element 33 can be changed by changing an ON-operation time of the current control element 34. In addition, the amount of the heat generated by the heating element 33 can be changed by changing intensity of the light radiated onto the current control element 34.

Although three series circuits of the heating elements 33 and the current control elements 34 are illustrated in FIG. 4, the series circuits of the heating elements 33 and the current control elements 34 are provided as many as the number of the temperature-controllable regions 31e. When, for example, there are one hundred temperature-controllable regions 31e, one hundred series circuits of the heating elements 33 and the current control elements 34 are provided.

Figure 5:
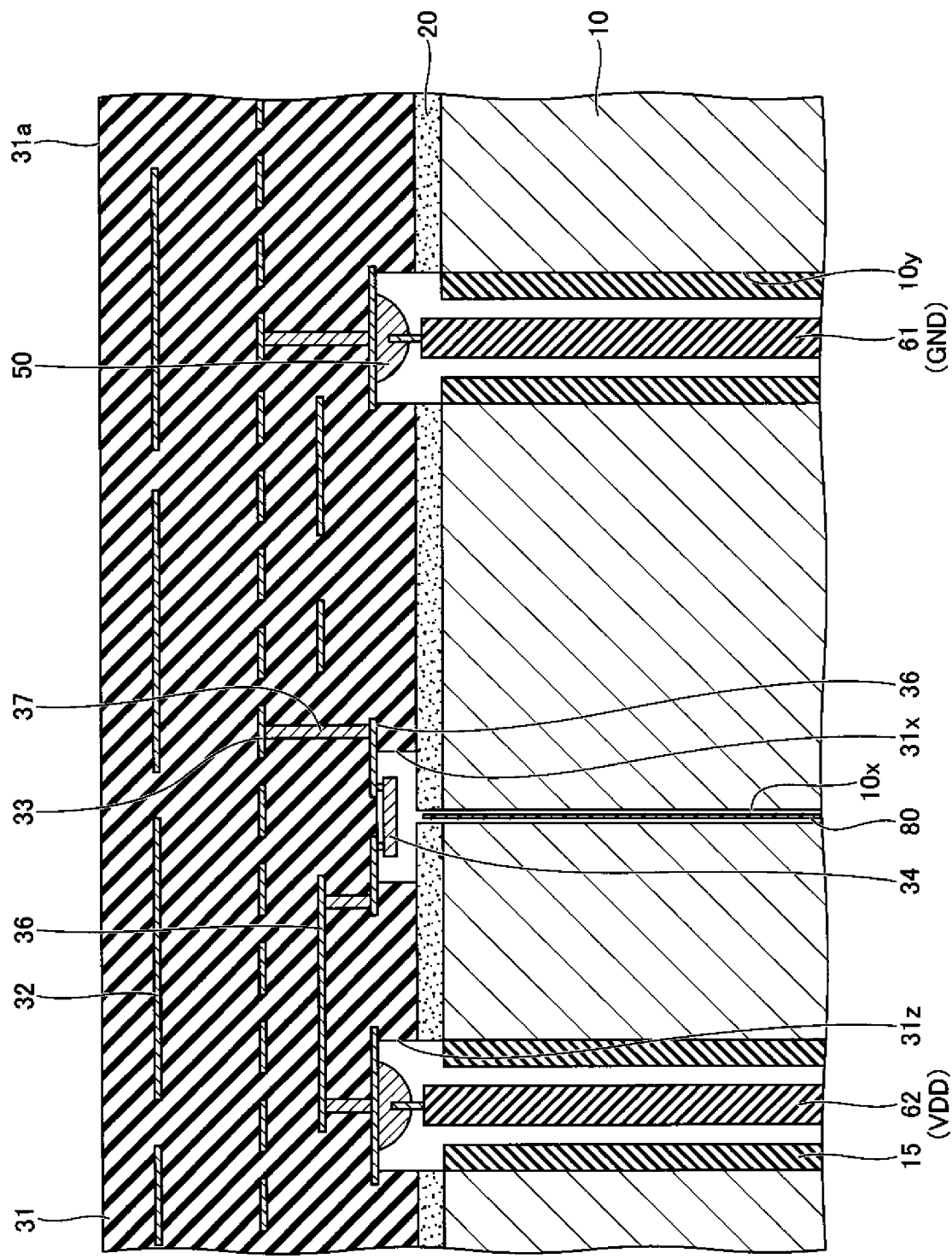
FIG. 5 is a partial cross-sectional view illustrating a mounting structure of a peripheral portion of a current control element.
Figure 6:
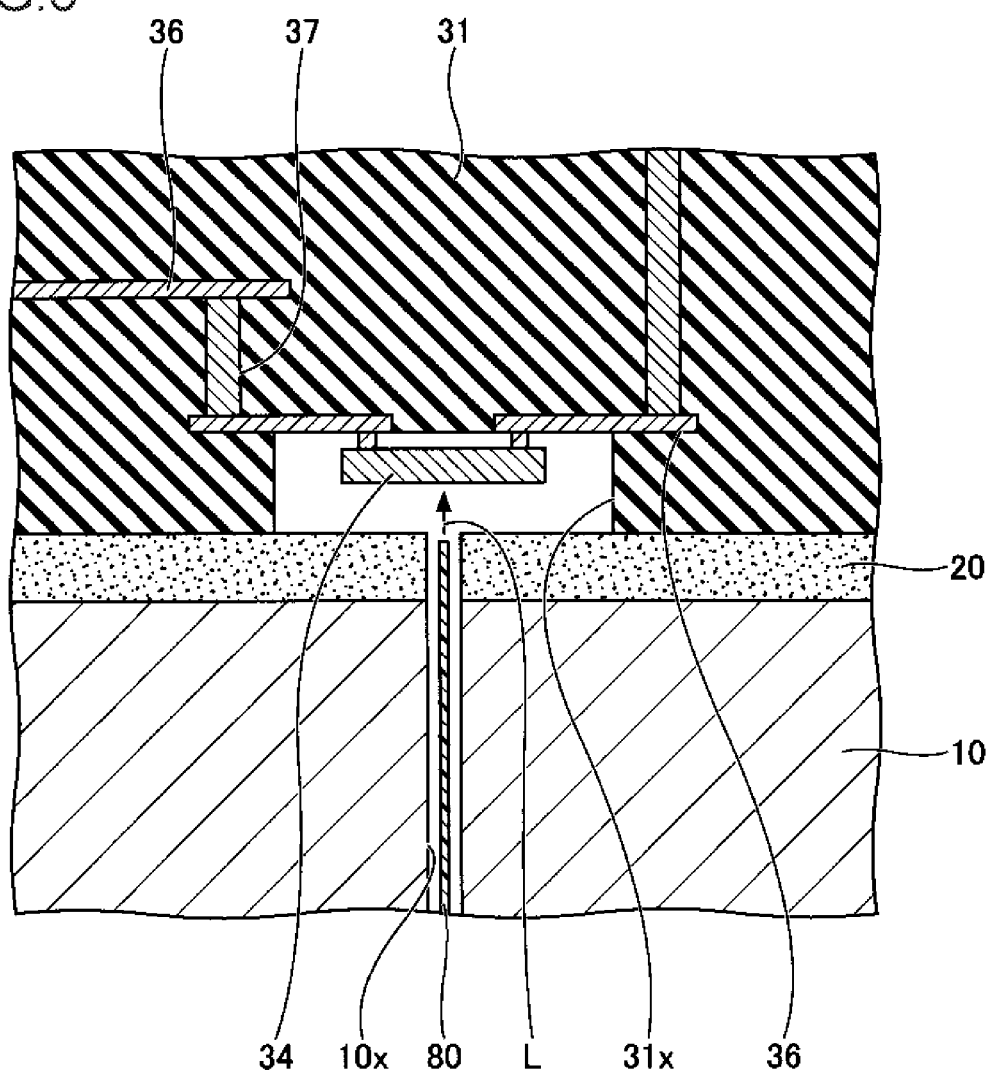
FIG. 6 is a partially enlarged cross-sectional view in which the peripheral portion of the current control element in FIG. 5 is enlarged.

FIG. 5 is a partial cross-sectional view illustrating a mounting structure of a peripheral portion of a current control element. FIG. 6 is a partially enlarged cross-sectional view in which the peripheral portion of the current control element in FIG. 5 is enlarged. With reference to FIG. 5 and FIG. 6, recesses 31x and 31z opened to the side of the adhesive layer 20 are formed in a lower face of the base body 31.

The recess 31x is a recess for disposing the current control element 34 therein. Such recesses 31x can be provided as many as the number of the current control elements 34. However, a plurality of current control elements 34 may be disposed in one recess 31x alternatively. Each of the recesses 31z is a recess in which a solder 50 for connecting an electric wire is disposed.

Wiring 36 is built in the base body 31. The wiring 36 includes a current control element mounting pad, solder connection pads, a wiring pattern, etc. The wiring 36 is formed in layers. Predetermined portions of the wiring 36 positioned in the different layers are connected to each other by via wirings 37. In addition, a predetermined portion of the wiring 36 is electrically connected to a predetermined portion of the heating element 33 by a via wiring 37. For example, tungsten (W), molybdenum (Mo), or the like can be used as the material of the wiring 36 and the via wirings 37.

The current control element mounting pad of the wiring 36 is exposed inside the recess 31x. The current control element 34 disposed inside the recess 31x is, for example, flip-chip mounted on the current control element mounting pad of the wiring 36.

A through hole 10x for letting an optical fiber 80 therethrough is formed in the base plate 10 and the adhesive layer 20 so as to communicate with the recess 31x. The light receiver of the current control element 34 disposed inside the recess 31x faces the side of the adhesive layer 20, and the optical fiber 80 through which light can be propagated to be radiated onto the light receiver of the current control element 34 is disposed in the through hole 10x. That is, the light receiver of the current control element 34 is disposed at such a position that the light receiver of the current control element 34 can receive light emitted from the optical fiber 80. The optical fiber 80 may be fixed to the through hole 10x by an adhesive agent or the like, or may be fixed to the base plate 10 through a socket provided on a lower face of the base plate 10.

The solder connection pads of the wiring 36 are exposed in the recesses 31z respectively. Through holes 10y each for letting an electric wire therethrough are formed in the base plate 10 and the adhesive layer 20 so as to communicate with the recesses 31z respectively. The GND electric wire 61 disposed inside one of the through holes 10y is electrically connected to one of the solder connection pads by a solder 50. The power supply VDD electric wire 62 disposed inside the other through hole 10y is electrically connected to the other solder connection pad by another solder 50.

Each of the electric wires 61 and 62 has, for example, a structure in which a conductor is clad with an insulator. The conductors of the electric wires 61 and 62 are electrically connected to the solder connection pads by the solders 50 respectively. In order to enhance insulating properties between the electric wires 61 and 62 and the base plate 10, it is preferable that insulating layers 15 are provided on inner walls of the through holes respectively. For example, resin, ceramic, or the like can be used as the insulating layers 15.

A relatively large current flows into the GND electric wire 61 and the power supply VDD electric wire 62. Therefore, the diameter of the through hole 10y in which each of the electric wires 61 and 62 is disposed is larger than the diameter of the through hole 10x in which the optical fiber 80 is disposed. Further, each of the diameters of the electric wires 61 and 62 is larger than the diameter of the optical fiber 80. The diameter of the through hole 10y in which the electric wire 61, 62 is disposed is, for example, φ5 mm, and the diameter of the through hole 10x in which the optical fiber 80 is disposed is, for example, φ0.5 mm. The diameter of the electric wire 61, 62 is, for example, φ4 mm, and the diameter of the optical fiber 80 is, for example, φ0.2 mm.

A method for manufacturing such a substrate fixing device 1 will be described. In order to manufacture the substrate fixing device 1, first, an electrostatic chuck 30 in which an electrostatic electrode 32, heating elements 33, and wiring 36 are built in a base body 31 is manufactured by a well-known manufacturing method including a step of processing vias in a green sheet, a step of filling the vias with an electrically conductive paste, a step of forming a pattern to serve as the electrostatic electrode, a step of forming patterns to serve as the heating elements, a step of forming a pattern to serve as the wiring, a step of laminating and baking another green sheet, a step of flattening the surface, etc.

Then, a required number of recesses 31x that are hollow from a lower face of the base body 31 toward a mounting face 31a of the base body 31 are formed to expose current control element mounting pads of the wiring 36. Further, a required number of recesses 31z that are hollow from the lower face of the base body 31 toward the mounting face 31a of the base body 31 are formed to expose solder connection pads of the wiring 36. The recesses 31x and 31z are formed, for example, by a method of laminating a perforated green sheet on the lowermost face.

Next, current control elements 34 are mounted on the current control element mounting pads of the wiring 36 exposed inside the recesses 31x, for example, by flip-chip mounting.

Next, conductor portions of electric wires are connected to the solder connection pads inside the recess 31z through solders 50. Then, an uncured adhesive layer 20 is formed on the lower face of the electrostatic chuck 30 except on the portions where the recesses 31x and 31z are formed. Further, a base plate 10 in which through holes 10x for letting optical fibers 80 therethrough, through holes 10y for letting the electric wires 61 and 62 therethrough, a refrigerant flow path, a gas supply path, and the like are formed is prepared. Then, the electric wires are let through the through holes 10y. Then, the base plate 10 is connected to the lower face of the electrostatic chuck 30 through the adhesive layer 20, and the adhesive layer 20 is cured. The optical fibers 80 are let through the through holes 10x. By the aforementioned steps, the substrate fixing device 1 shown in FIG. 1 is completed.

An effect obtained by the electrostatic chuck 30 constituting the substrate fixing device 1 will be described with a comparative example.

Figure 7:
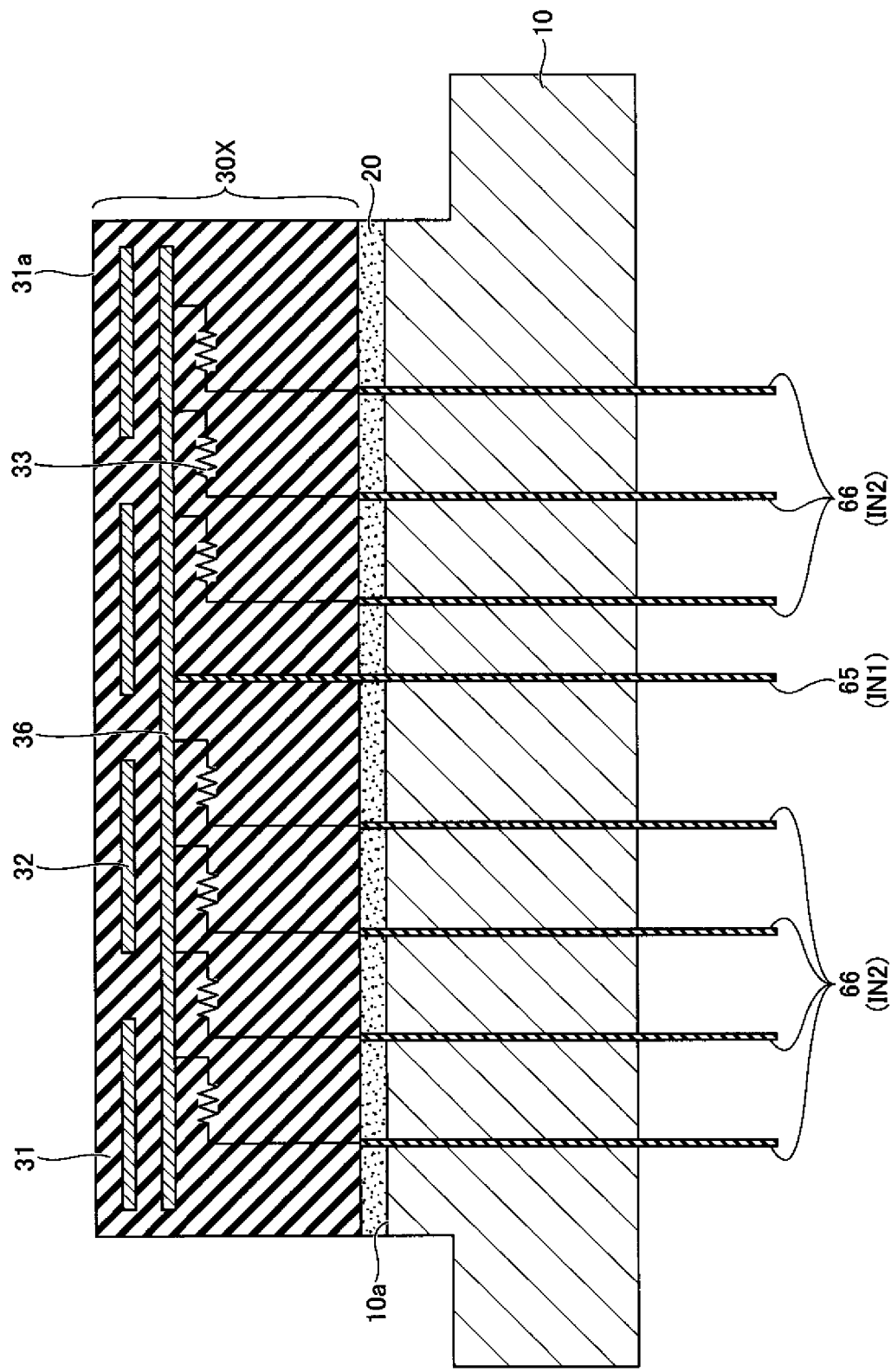
FIG. 7 is a schematic cross-sectional view illustrating a substrate fixing device according to a comparative example in a simplified manner.

FIG. 7 is a schematic cross-sectional view illustrating a substrate fixing device 1X according to the comparative example in a simplified manner. With reference to FIG. 7, the substrate fixing device 1X differs from the substrate fixing device 1 (see FIG. 1 etc.) in that the electrostatic chuck 30 is replaced with an electrostatic chuck 30X.

The electrostatic chuck 30X has a base body 31, an electrostatic electrode 32, heating elements 33, and wiring 36 as main constituent elements. No current control element 34 is built in the electrostatic chuck 30X. A plurality of temperature-controllable regions 31e whose temperatures can be controlled independently are defined in the base body 31 in a plan view in a manner similar to or the same as that in FIG. 2. Further, one heating element 33 is disposed in each of the temperature-controllable regions 31e in a manner similar to or the same as that in FIG. 3. The heating elements 33 disposed in the temperature-controllable regions 31e respectively are insulated from one another. By changing a value of a current flowing into each of the heating elements 33, an amount of heat generated by the heating element 33 can be changed independently.

One ends of the heating elements 33 are connected to one another through the wiring 36 and then connected to an input/output electric wire 65 (IN1). The electric wire 65 (IN1) is led out to the outside of the substrate fixing device 1X. The other ends of the heating elements 33 are connected to input/output electric wires 66 (IN2) respectively. The electric wires 66 (IN2) are led out to the outside of the substrate fixing device 1X. The total of the electric wire 65 and the electric wires 66 is the number of the heating elements 33+1. When, for example, there are one hundred heating elements 33, the total of the electric wire 65 and the electric wires 66 is one hundred and one.

For example, one of the electric wire 65 and each electric wire 66 is connected to the GND and the other of the electric wire 65 and the electric wire 66 is connected to a power supply. An amount of heat generated by each heating element 33 can be changed by a value of a voltage applied between the opposite ends of the heating element through the electric wire 65 (IN1) and the electric wire 66 (IN2). Alternatively, a constant voltage (pulsed voltage) may be supplied between the opposite ends of each heating element via the electric wire 65 and the electric wire 66, so that the amount of heat generated by the heating element 33 can be changed by changing a time during which the voltage is supplied to the heating element 33.

Since a relatively large current required for heat generation of the heating element 33 flows into the electric wire 65 and the electric wire 66, the diameter of each of through holes 10y in which the electric wire 65, 66 is disposed is, for example, $\phi$5 mm. Further, the diameter of the electric wire 65, 66 is, for example, $\phi$4 mm. Therefore, as the total number of the electric wire 65 and the electric wires 66 increases, an area occupied by the through holes 10y in the base plate 10 becomes so large that it cannot be ignored.

For example, assume that the number of the temperature-controllable regions 31e is 100 in the case of the structure of the substrate fixing device 1X according to the comparative example shown in FIG. 7. In this case, the number of electrical connection lines between the substrate fixing device and the outside is 100 or more. That is, it is necessary to lead out the one hundred or more electric wires to the outside through the through holes 10y formed in the base plate 10. In this case, the area occupied by the through holes 10y in the base plate 10 becomes so large that it cannot be ignored, as described above, and the degree of freedom for designing the base plate 10 significantly decreases.

Also in the case of the substrate fixing device 1, the optical fibers 80 equal in number to the temperature control regions 31e are required. However, the diameter of each of the through holes 10y in which the electric wire 61, 62 is disposed is about $\phi$5 mm, as described above, whereas the diameter of each of the through holes 10x in which the optical fiber 80 is disposed is about $\phi$0.5 mm to be about one tenth of the diameter of the through hole 10y.

Therefore, even in a case where a large number of the through holes 10x are provided in the base plate 10, the area occupied by the through holes 10x in the base plate 10 is substantially reduced as compared with a case where the same number of the through holes 10y are provided in the base plate 10. That is, the electrostatic chuck 30 of the substrate fixing device 1 can suppress the decrease in the degree of freedom for designing the base plate 10 even in the case where the large number of the through holes 10x are provided in the base plate 10.

Further, the outside to which the substrate fixing device 1 is electrically connected only consists of the power supply (VDD) and the GND, as described above. Accordingly, cost can be reduced due to a reduction in the number of components required for the connection of the substrate fixing device 1 to the outside. Further, assembly difficulty can be greatly decreased due to a significant reduction in the number of soldering points, etc., so that an improvement in yield and reliability can be expected, Since the electrostatic chuck 30 is a consumable component, a cost reduction effect obtained by the improvement of the yield is large.

Further, the optical fibers 80 do not have to be electrically insulated from the base plate 10. Accordingly, no insulating material or the like is required in each of the through holes 10x, which also leads to cost reduction.

(Modification 1 of First Embodiment)

An example in which the position of the front end of each of optical fibers is retracted downward is shown in a modification 1 of the first embodiment. In the modification 1 of the first embodiment, description about constituent elements having the same reference signs as those in the aforementioned embodiment may be omitted.

Figure 8:
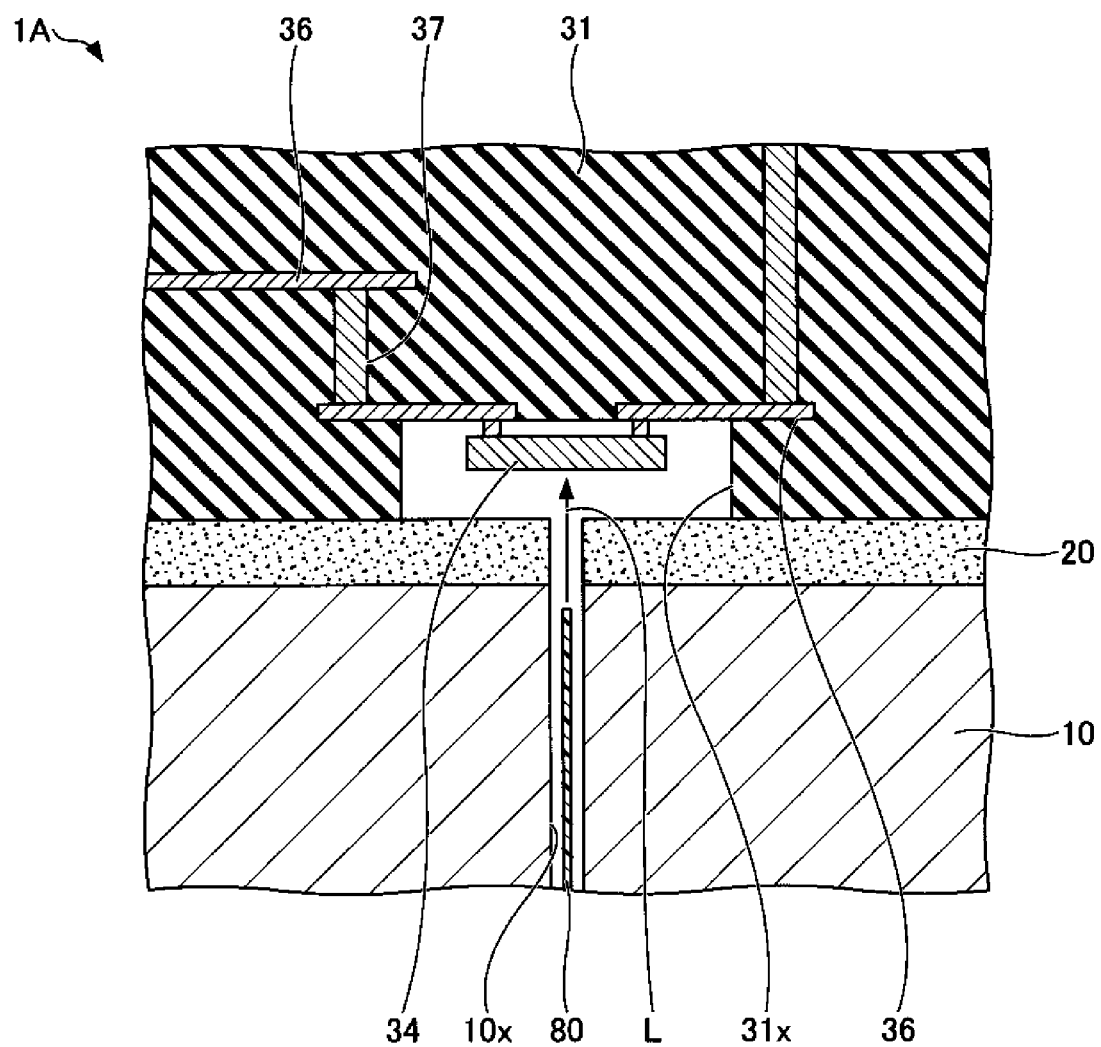
FIG. 8 is a partially enlarged cross-sectional view in which a peripheral portion of a current control element in a substrate fixing device according to a modification 1 of the first embodiment is enlarged.

FIG. 8 is a partially enlarged cross-sectional view in which a peripheral portion of a current control element in a substrate fixing device according to the modification 1 of the first embodiment is enlarged.

In FIG. 8, a light receiver of the current control element 34 disposed inside a recess 31x faces the side of an adhesive layer 20 so as to receive light radiated via the optical fiber 80, in a manner similar to or the same as that in the case of FIG. 6.

In FIG. 6, the front end of the optical fiber 80 is positioned in the through hole 10x formed in the adhesive layer 20. On the other hand, in FIG. 8, the front end of the optical fiber 80 is positioned in a through hole 10x formed in a base plate 10 but does not go into a through hole 10x formed in the adhesive layer 20.

Due to a difference in coefficient of thermal expansion between the base plate 10 and a base body 31, the base body 31 is generally displaced in a horizontal direction with respect to the base plate 10 depending on temperature conditions. On this occasion, the adhesive layer 20 is also displaced. Accordingly, when the front end of the optical fiber 80 goes into the through hole 10x formed in the adhesive layer 20, the front end of the optical fiber 80 may bear damage such as deterioration. As shown in FIG. 8, the front end of the optical fiber 80 is positioned in the through hole 10x formed in the base plate 10 and does not go into the through hole 10x formed in the adhesive layer 20. Accordingly, the front end of the optical fiber 80 can avoid bearing damage such as deterioration. An amount of the displacement of the base body 31 with respect to the base plate 10 is larger toward an outer circumferential side of the base body 31. Therefore, a particularly conspicuous effect is obtained in those through holes 10x disposed on the outer circumferential side of the base plate 10.

(Modification 2 of First Embodiment)

A substrate fixing device 1B is shown by way of example in a modification 2 of the first embodiment. The substrate fixing device 1B is provided with an electrostatic chuck in which another heating element 40 generating heat due to a voltage applied thereto from the outside is built in a different layer from a layer of heating elements 33 in a base body 31. In the modification 2 of the first embodiment, description about constituent elements having the same reference signs as those in the aforementioned embodiment may be omitted.

FIG. 9 is a schematic cross-sectional view illustrating the substrate fixing device 1B according to the modification 2 of the first embodiment in a simplified manner. With reference to FIG. 9, the substrate fixing device 1B differs from the substrate fixing device 1 (see FIG. 1 etc.) in that the electrostatic chuck 30 is replaced with an electrostatic chuck 30B. Further, the electrostatic chuck 30B differs from the electrostatic chuck 30 (see FIG. 1 etc.) in that the heating element 40, an electric wire 68, and an electric wire 69 are added.

The heating element 40 whose temperature can be controlled independently of the heating elements 33 is disposed in the different layer from the layer of the heating elements 33 in the electrostatic chuck 30B. The heating element 40 can be, for example, disposed between an electrostatic electrode 32 and the heating elements 33 in a thickness direction. The heating element 40 which is, for example, a single resistor formed into a spiral pattern or the like is disposed to heat an entire mounting face 31a of the base body 31 over a plurality of temperature-controllable regions 31e. The material of the heating element 40 is, for example, similar to or the same as that of the heating elements 33.

One end of the heating element 40 is connected to the input/output IN1 electric wire 68. The electric wire 68 is led out to the outside of the substrate fixing device 1B. The other end of the heating element 40 is connected to the input/output IN2 electric wire 69. The electric wire 69 is led out to the outside of the substrate fixing device 1B. Thus, there are one electric wire 68 and one electric wire 69.

For example, one of the electric wire 68 and the electric wire 69 is connected to the ground GND, and the other of the electric wire 68 and the electric wire 69 is connected to a power supply. An amount of heat generated by the heating element 40 can be changed by a value of a voltage applied between the opposite ends of the heating element 40 through the electric wire 68 and the electric wire 69. Alternatively, a constant voltage (pulsed voltage) may be supplied between the opposite ends of the heating element 40 through the electric wire 68 and the electric wire 69 so that the amount of heat generated by the heating element 40 can be changed by changing a time during which the voltage is applied to the heating element 40.

Thus, the heating element 40 may be built separately from the heating elements 33 in the base body 31. For example, a current is made to flow into the heating element 40 to heat the mounting face 31a of the base body 31, and only portions of the mounting face 31a which are not heated sufficiently are heated by the heating elements 33. With this arrangement, the entire mounting face 31a of the base body 31 can be heated uniformly.

In the above description, the heating element 40 is set as a single resistor. However, the heating element 40 may be set as a plurality of independent resistors so as to control temperatures of a plurality of regions independently.

Besides a semiconductor wafer (such as a silicon wafer), for example, a glass substrate or the like used in a process of manufacturing a liquid crystal panel or the like can be exemplified as the object adsorbed by the substrate fixing device according to the present disclosure.

Although the preferred embodiments etc. have been described in detail, the invention is not limited to the above-described embodiments etc. and various modifications and replacements can be made in the above-described embodiments etc. without departing from the scope of the claims.

What is claimed is:

1. An electrostatic chuck configured to adsorb and retain an object thereon, the electrostatic chuck comprising:
   a base body on which the object is mounted;
   an electrostatic electrode that is provided in the base body;
   a plurality of heating elements that are provided in the base body; and
   a plurality of current control elements that are provided in the base body, and each of which is connected in series with a corresponding one of the heating elements;

wherein each of operations of the current control elements is controlled in accordance with light radiated toward a corresponding one of the current control elements from an outside of the base body.

2. The electrostatic chuck according to claim 1, wherein a first current control element of the current control elements is connected in series with a first heating element of the heating elements, and in accordance with light radiated toward the first current control element of the current control elements, an operation of the first current control element is controlled so as to allow a current to flow into the first heating element.

3. The electrostatic chuck according to claim 1, wherein:
the base body is divided into a plurality of regions,
temperatures of the regions is controlled independently, and
each of the heating elements is disposed in a corresponding one of the regions.

4. The electrostatic chuck according to claim 1, wherein each of the current control elements is a phototransistor.

5. The electrostatic chuck according to claim 1, further comprising:
another heating element that is provided in the base body, wherein a position of the other heating element is different from positions of the heating elements in a thickness direction of the electrostatic chuck.

6. The substrate fixing device comprising:
a base plate that has a plurality of through holes;
an electrostatic chuck according to claim 1 that is mounted on one face of the base plate; and
a plurality of optical fibers each of which is configured to emit light toward a corresponding one of the current control elements and each of which is disposed in a corresponding one of the through holes,
wherein each of the through holes faces a corresponding one of the current control elements.

7. The substrate fixing device according to claim 6, further comprising:
an adhesive layer that is provided between a first face of the base body and the base plate to fix the electrostatic chuck and the base plate to each other,
wherein the through holes are formed in the base plate and the adhesive layer so as to expose the first face of the base body.

8. The substrate fixing device according to claim 7, wherein
each of front ends of the optical fibers is positioned in a corresponding one of the through holes formed in the base plate.

9. The substrate fixing device according to claim 7, wherein
each of front ends of the optical fibers is positioned in a corresponding one of the through holes formed in the adhesive layer.

* * * * *